United States Patent [19]
Lawton

[11] Patent Number: 4,612,510
[45] Date of Patent: Sep. 16, 1986

[54] FM DEMODULATOR USING COMBINED OUTPUTS OF PLURAL FM DETECTORS

[75] Inventor: Rodney J. Lawton, Swindon, England

[73] Assignee: Plessey Overseas Limited, Ilford, England

[21] Appl. No.: 679,943

[22] Filed: Dec. 10, 1984

[30] Foreign Application Priority Data

Dec. 9, 1983 [GB] United Kingdom ............... 8332897
Jun. 1, 1984 [GB] United Kingdom ............... 8414056

[51] Int. Cl.[4] .................... H03D 3/00; H03K 9/06
[52] U.S. Cl. ................................ 329/107; 329/112; 329/126; 375/80; 375/94
[58] Field of Search ........... 329/104, 107, 110, 112, 329/126, 137, 122, 124; 375/44, 78, 80, 81, 94; 455/214

[56] References Cited
U.S. PATENT DOCUMENTS

3,863,161  1/1975  Johnson et al. ............... 329/110 X

Primary Examiner—Siegfried H. Grimm
Attorney, Agent, or Firm—Fleit, Jacobson, Cohn & Price

[57] ABSTRACT

An FM detection apparatus comprising a frequency dividing means, having a division ratio N, arranged to receive an incoming radio frequency (RF) signal carrying frequency modulation and to frequency divide the RF signal to provide a plurality of frequency divided signals each at the same frequency but mutually phase displaced so that the RF signal is represented by the divided signals in combination, a plurality of FM detectors arranged so that each FM detector receives a different one of the frequency divided signals and provides an output signal corresponding to the frequency modulation carried by the received frequency divided signal, and adding means operative to combine the output signals to provide a demodulated signal corresponding to the modulation carried by the incoming RF signal.

9 Claims, 4 Drawing Figures

4,612,510

FM DEMODULATOR USING COMBINED OUTPUTS OF PLURAL FM DETECTORS

FIELD OF THE INVENTION

This invention relates to frequency modulation (FM) detection apparatus.

BACKGROUND OF THE INVENTION

In known FM detection apparatus an incoming radio frequency (RF) signal carrying a frequency modulation is shifted down in frequency to an intermediate frequency (IF) signal. The IF signal is then demodulated so that an output signal having the characteristics of the frequency modulation is obtained. In conventional FM detection apparatus, the RF signal is shifted down to an IF signal by one or more mixing circuits, however in some known FM detection apparatus, the RF signal is shifted down to the IF signal by a frequency divider having, for example, a division ratio of N, and in this case the frequency of the IF signal is 1/N of the frequency of the RF signal.

Shifting down the frequency of the RF signal in this way is disadvantageous in that the IF signal contains only 1/N of the characteristics contained in the frequency modulation. Therefore, for an incoming RF signal having a low signal-to-noise ratio, the number of characteristics in the frequency modulation carried by the IF signal may be insufficient for an accurate model of the frequency modulation carried by the incoming RF signal to be reconstructed. Hence the maximum value of N is limited by Nyquist considerations.

SUMMARY OF THE INVENTION

According to the present invention an FM detection apparatus comprises a frequency dividing means, having a division ratio N, arranged to receive an incoming radio frequency (RF) signal carrying frequency modulation and to frequency divide the RF signal to provide a plurality of frequency divided signals each at the same frequency but mutually phase displaced so that the RF signal is represented by the divided signals in combination, a plurality of FM detectors arranged so that each FM detector receives a different one of the frequency divided signals and provides an output signal corresponding to the frequency modulation carried by the received frequency divided signal, and adding means operative to combine the output signals to provide a demodulated signal corresponding to the modulation carried by the incoming RF signal.

It is a consequence of frequency dividing the RF signal, that the frequency modulation is divided between the frequency divided signals provided by the dividing means. Apparatus embodying the present invention has the advantage that the frequency modulation carried by each of the frequency divided signals is combined so that all or substantially all of the characteristics contained in the modulation carried by the RF signal are contained in the demodulated signal.

FM detection apparatus embodying the present invention has the advantage that for a given division ratio N, information which would be lost in known FM detection apparatus using frequency dividers is retained, so that signals having a lower signal-to-noise ratio can be detected without loss of the signal due to Nyquist considerations.

The number of frequency divided signals is preferably equal to the division ratio N of the frequency dividing means. Hence, if in an embodiment of the present invention, the division ratio of the dividing means in N equal to 2, the number of frequency divided signals is also equal to 2.

The frequency dividing means may take the form of one or more dividers having a division ratio of N=2, the dividers being arranged so that the overall division ratio of the frequency dividing means is equal to the division ratio N.

The FM detectors used may be, for example, a quadrature type detector, a phase locked loop type detector, or a pulse counting detector.

BRIEF DESCRIPTION OF THE DRAWINGS

The invention will now be further described by way of example with reference to the accompanying drawings in which.

DETAILED DESCRIPTION OF THE INVENTION

Figure 1A:
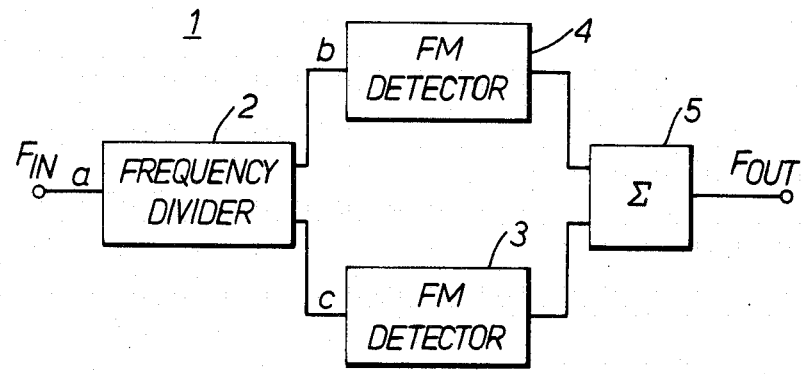
FIG. 1a shows an embodiment of the present invention which comprises a frequency divider having a division ratio of N=2, a pair of FM detectors and an adding means.
Figure 1B:
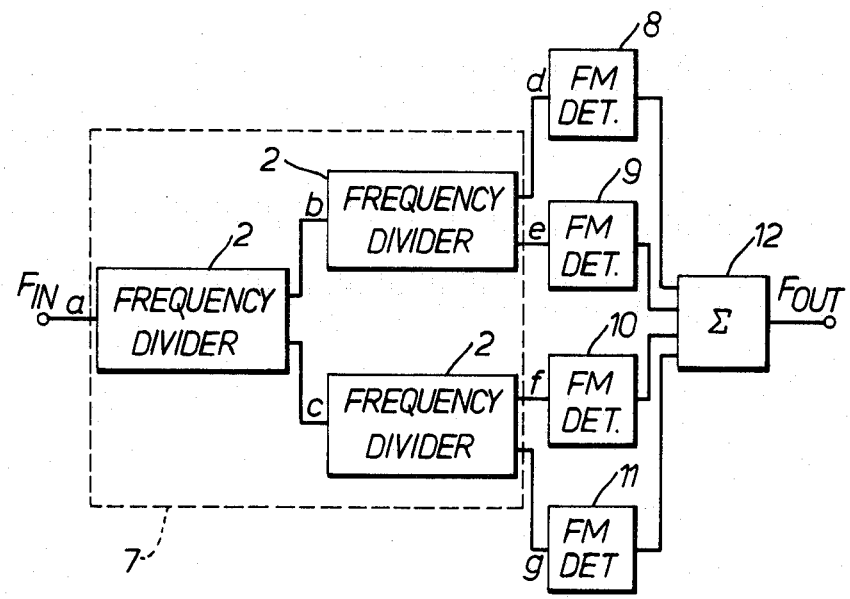
FIG. 1b shows an embodiment of the present invention in which the frequency dividing means has a division ratio of N=4.
Figure 2:
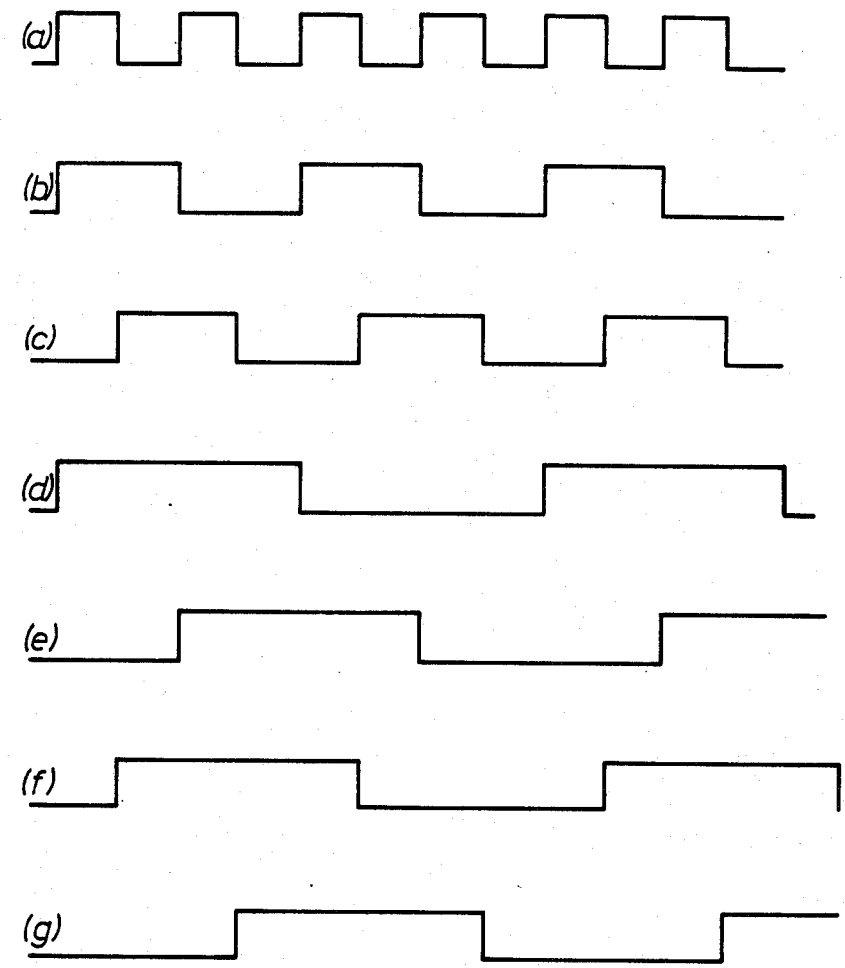
FIG. 2 shows waveform diagrams which will be used to explain the operation of the embodiments of FIGS. 1a and 1b.

Referring first to FIG. 1a, an FM detection apparatus 1 is shown in which an incoming radio frequency (RF) signal $F_{in}$ is fed to a frequency divider 2 which has a division ratio of N=2. The signal $F_{in}$ is a radio frequency signal carrying a frequency modulation. The operation of the FM detection apparatus of FIGS. 1a and 1b are described with reference to a simplified waveform representing the signal $F_{in}$ which is shown in FIG. 2 as waveform a. The waveform a shown in FIG. 2 consists of a pulse train having a frequency of F cycles per second. The frequency divider 2 frequency divides the signal $F_{in}$ to provide a pair of frequency divided signals of waveform b and c of FIG. 2. Consequently, the frequency modulation which is modulated on the RF signal is divided equally between the frequency divided signals b and c. The frequency divider 2 has a division ratio of N=2, and so the frequency of the pair of frequency divided signals b and c is F/2 cycles per second, and as illustrated in FIG. 2, the frequency divided signals of waveform b and c are in phase quadrature with respect to one another.

Each of the signals of waveform b and c is fed to a quadrature type FM detector 3 and 4 respectively. The FM detectors 3 and 4 demodulate the frequency divided signals of waveform b and c to provide respective output signals corresponding to the frequency modulation carried by the received frequency divided signals of waveform b and c. Each of the respective output signals is then fed to an adding means 5 which is operative to combine the output signals to provide a demodulated signal $F_{out}$ corresponding to the frequency modulation carried by the signal $F_{in}$. The adding means 5 will be described in further detail later.

FIG. 1b shows a second embodiment of the present invention in which a frequency divider 7, having a division ratio of N=4 comprises a cascade of frequency dividers 2 each having a division ratio of N=2. An incoming radio frequency (RF) signal $F_{in}$ is fed into the frequency divider 7, the waveform of the signal $F_{in}$ being represented by the waveform a shown in FIG. 2. The frequency divider 7 frequency divides the signal $F_{in}$ to provide frequency divided signals of waveform d, e, f and g of FIG. 2 which are phase displaced with respect to one another, and each have a frequency of ¼ of the RF signal $F_{in}$. In consequence to the signal $F_{in}$ being divided, the frequency modulation is divided between of the signals of waveform d, e, f and g of FIG. 2 which may be combined to represent the RF signal $F_{in}$ and the frequency modulation carried thereon. Each of the frequency divided signals of waveform d to g are fed to a different FM detector 8, 9, 10 and 11 respectively. The FM detectors 8 to 11 demodulate the frequency divided signal received to provide an output signal corresponding to the divided frequency modulation carried by the respective signal waveforms d, e, f and g. The output signals from the FM detectors 8 to 11 are fed to an adding means 12 which combines each of the outut signals to provide a demodulated signal $F_{out}$ corresponding to the frequency modulation carried by the signal $F_{in}$, which signal $F_{out}$ retains all the information contained in the frequency modulation which is modulated on the incoming RF signal $F_{in}$.

It will be understood from the foregoing that a frequency divider having any desired division ratio may be employed in an FM detection apparatus embodying the present invention. Therefore, provided each of the frequency divided signals provided by the frequency divider is fed to an FM detector, and the output signals from the FM detectors are combined, all of the information contained in the frequency modulation carried by the incoming RF signal will be retained.

Figure 3:
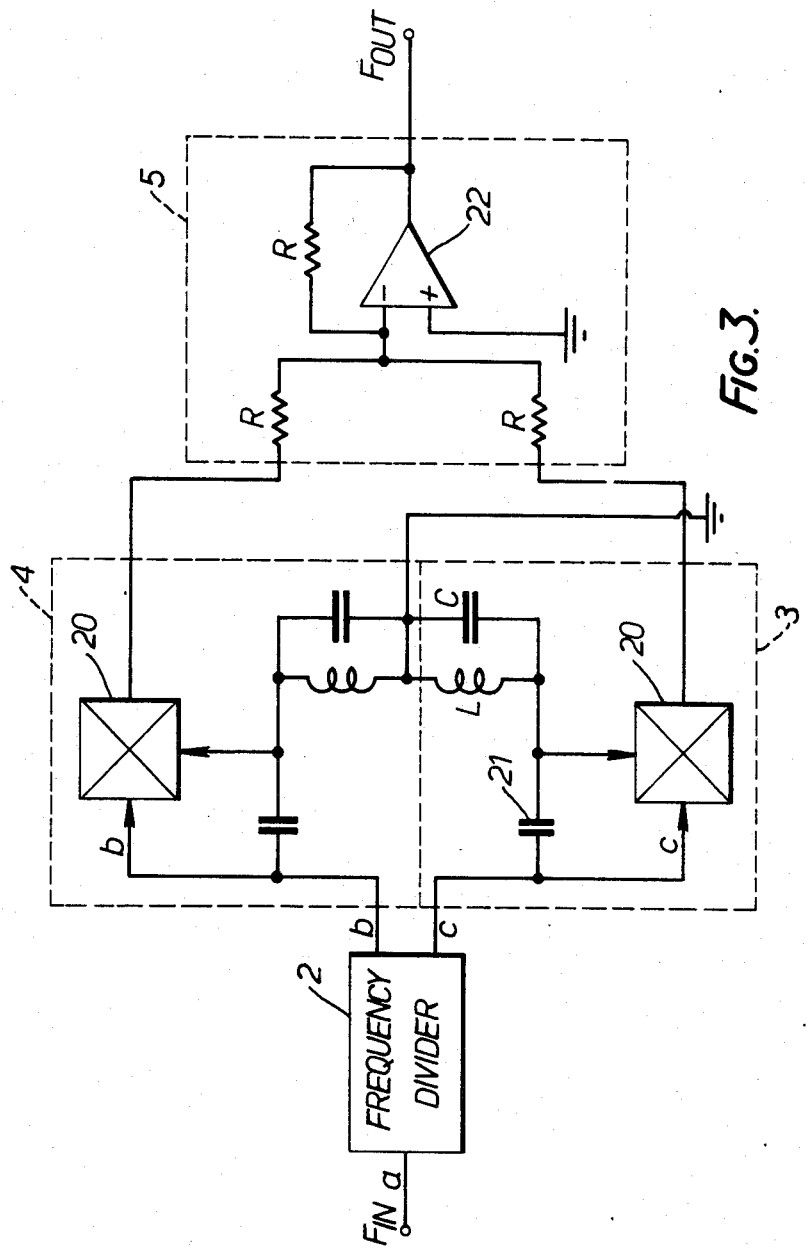
FIG. 3 shows the FM detectors and the adding means of FIG. 1a in more detail.

Referring now to FIG. 3, the embodiment shown in FIG. 1a will be described in greter detail. The frequency divider 2 may consist of a divider such as the one described in our U.K. granted Patent No. 1217502. The FM detectors 3 and 4 are similar in construction. The FM detector 3 comprises a phase sensitive detector 20 which receives the frequency divided signal of waveform c and compares its phase with the frequency divided signal of waveform c after it has been passed through a quadrature delay 21 (for example, a capacitor). The coil L and the capacitor C cause the quadrature delayed frequency divided signal of waveform c to vary in phase in dependence on its frequency. Therefore, the phase sensitive detector 20 provides an output signal corresponding to the divided portion of the frequency modulation carried by the signal of waveform c.

The output signals provided by the FM detectors 3 and 4 are fed to the adding means 5 which comprises a pair of resistors R, one end of which are connected to respective outputs of the FM detectors 3 and 4 and the other ends of which are connected to a negative input of an operational amplifier 22. A third resistor R connects the negative input of the operational amplifier 22 with the output of the operational amplifier 22, the adding means 5 being operative to combine the received output signals to provide a demodulated signal $F_{out}$ which corresponds to the frequency modulation carried by the incoming RF signal $F_{in}$.

Embodiments of the present invention may be used instead of or in association with mixing circuits of a super-heterodyne receiver. In particular, embodiments of the present invention can be implemented in integrated circuit form and are eminently suitable for use in FM detection apparatus in which the incoming radio frequency signal is very weak, and therefore has a low signal-to-noise ratio, for example, as in satellite communication systems or in power saving devices such as pagers.

I claim:

1. An FM detection apparatus comprising a frequency dividing means, having a division ratio N, arranged to receive an incoming radio frequency (RF) signal carrying frequency modulation and to frequency divide the RF signal to provide a plurality of frequency divided signals each at the same frequency but mutually phase displaced so that the RF signal is represented by the divided signals in combination, a plurality of quadrature type FM detectors arranged so that each quadrature type FM detector receives a different one of the frequency divided signals and provides an output signal corresponding to the frequency modulation carried by the received frequency divided signal, and adding means operative to combine the output signals to provide a demodulated signal corresponding to the modulation carried by the incoming RF signal.

2. An FM detection apparatus according to claim 1, wherein the number of frequency divided signals is equal to the division ratio N of the frequency dividing means.

3. An FM detection apparatus according to claim 1, wherein the frequency dividing means comprising at least one divider having a division ratio of N=2, the overall division ratio of the frequency dividing means is equal to the division ratio N.

4. An FM detection apparatus comprising a frequency dividing means, having a division ratio N, arranged to receive an incoming radio frequency (RF) signal carrying frequency modulation and to frequency divide the RF signal to provide a plurality of frequency divided signals each at the same frequency but mutually phase displaced so that the RF signal is represented by the divided signals in combination, a plurality of phase locked loop FM detectors arranged so that each phase locked loop FM detector receives a different one of the frequency divided signals and provides an output signal corresponding to the frequency modulation carried by the received frequency divided signal, and adding means operative to combine the output signals to provide a demodulated signal corresponding to the modulation carried by the incoming RF signal.

5. An FM detection apparatus according to claim 4, wherein the number of frequency divided signals is equal to the division ratio N of the frequency dividing means.

6. An FM detection apparatus according to claim 4, wherein the frequency dividing means comprises at least one divider having a division ratio of N=2, the overall division ratio of the frequency dividing means is equal to the division ratio N.

7. An FM detection apparatus comprising a frequency dividing means, having a division ratio N, arranged to receive an incoming radio frequency (RF) signal carrying frequency modulation and to frequency divide the RF signal to provide a plurality of frequency divided signals each at the same frequency but mutually phase displaced so that the RF signal is represented by the divided signals in combination, a plurality of pulse counting FM detectors arranged so that each pulse counting FM detector receives a different one of the frequency divided signals and provides an output signal corresponding to the frequency modulation carried by the received frequency divided signal, and adding means operative to combine the output signals to provide a demodulated signal corresponding to the modulation carried by the incoming RF signal.

8. An FM detection apparatus according to claim 7, wherein the number of frequency divided signals is equal to the division ratio N of the frequency dividing means.

9. An FM detection apparatus according to claim 7, wherein the frequency dividing means comprises one or more dividers each having a division ratio of $N=2$, the overall division ratio of the frequency dividing means is equal to the division ratio N.

* * * * *